US006385128B1

(12) United States Patent
Arcoleo et al.

(10) Patent No.: US 6,385,128 B1
(45) Date of Patent: May 7, 2002

(54) RANDOM ACCESS MEMORY HAVING A READ/WRITE ADDRESS BUS AND PROCESS FOR WRITING TO AND READING FROM THE SAME

(75) Inventors: Mathew R. Arcoleo, San Jose; Cathal G. Phelan, Mountain View; Ashish Pancholy; Simon J. Lovett, both of Milpitas, all of CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/878,433

(22) Filed: Jun. 11, 2001

Related U.S. Application Data

(62) Division of application No. 09/238,954, filed on Jan. 27, 1999, now Pat. No. 6,262,937
(60) Provisional application No. 60/078,029, filed on Mar. 13, 1998.

(51) Int. Cl.$^7$ .................................................. G11C 8/00
(52) U.S. Cl. .................. 365/233; 365/230.05; 365/220; 365/190
(58) Field of Search ................................ 365/233, 190, 365/230.05, 220, 189.04

(56) References Cited

U.S. PATENT DOCUMENTS

| | | | |
|---|---|---|---|
| 4,169,284 A | 9/1979 | Hogan et al. ............... 711/140 |
| 4,245,304 A | 1/1981 | Porter et al. ................ 711/122 |
| 4,456,965 A | 6/1984 | Graber et al. ............... 710/100 |
| 4,539,661 A | 9/1985 | Oritani ..................... 365/233.5 |
| 4,575,826 A | 3/1986 | Dean ........................... 365/222 |
| 4,599,708 A | 7/1986 | Schuster ..................... 365/174 |
| 4,752,871 A | 6/1988 | Sparks et al. .......... 365/185.11 |
| 4,783,732 A | 11/1988 | Morton .................. 365/230.05 |
| 4,849,937 A | 7/1989 | Yoshimoto ............. 365/189.05 |
| 4,882,709 A | 11/1989 | Wyland .................. 365/189.02 |
| 5,023,838 A | 6/1991 | Herbert .................. 365/189.08 |
| 5,309,395 A | 5/1994 | Dickinson et al. ...... 365/189.04 |
| 5,394,361 A | 2/1995 | Dickinson .............. 365/189.04 |
| 5,440,717 A | 8/1995 | Bosshart ...................... 711/159 |
| 5,530,673 A | 6/1996 | Tobita et al. ........... 365/185.09 |
| 5,546,569 A | 8/1996 | Proebsting et al. ......... 713/600 |
| 5,561,781 A | 10/1996 | Braceras et al. ............. 711/131 |
| 5,598,545 A | 1/1997 | Childers et al. ............. 712/221 |
| 5,638,534 A | 6/1997 | Mote, Jr. ..................... 711/158 |
| 5,648,987 A | 7/1997 | Yang et al. .................. 375/232 |
| 5,752,270 A | 5/1998 | Wada .......................... 711/169 |
| 5,781,480 A | 7/1998 | Nogle et al. ........... 365/189.04 |
| 5,828,606 A | 10/1998 | Mick ...................... 365/189.05 |
| 5,838,631 A | 11/1998 | Mick .......................... 365/233 |
| 5,841,732 A | 11/1998 | Mick .......................... 365/233 |
| 5,875,151 A | 2/1999 | Mick .......................... 365/233 |
| 5,926,426 A | 7/1999 | Han ............................ 365/205 |
| 5,956,286 A | 9/1999 | Lattimore et al. ...... 365/230.05 |
| 5,978,279 A | 11/1999 | Park ....................... 365/189.04 |
| 5,983,328 A | 11/1999 | Potts et al. .................. 711/157 |
| 6,069,839 A | 5/2000 | Pancholy et al. ........... 365/233 |
| 6,081,478 A | 6/2000 | Mick et al. ................. 365/233 |
| 6,094,399 A | 7/2000 | Mick .......................... 365/233 |
| 6,262,936 B1 | 7/2001 | Arcoleo et al. ............. 365/233 |
| 6,262,937 B1 | 7/2001 | Arcoleo et al. ............. 365/233 |

Primary Examiner—Andrew Q. Tran
(74) Attorney, Agent, or Firm—Christopher P. Maiorana, P.C.

(57) ABSTRACT

A random access memory with a data input bus, a data output bus, a random access memory array configured to transfer data to random write addresses and from random read addresses in the random access memory array, an address bus providing the random read addresses and the random write addresses, and a first periodic signal configured to control data transfer operations (i) to the random access memory array in response to a first transition of the periodic signal and (ii) from the random access memory array in response to a second transition of the periodic signal, wherein the second transition of the periodic signal is complementary to the first transition of the periodic signal. One preferred embodiment further includes circuitry operable to write data into and read data from the random access memory array. Other preferred embodiments further include a write data register and/or a read data register. In a further embodiment, each of the data input bus and the data output bus is unidirectional. The invention also concerns a process for reading data from and writing data to a random access memory array.

6 Claims, 5 Drawing Sheets

RANDOM ACCESS MEMORY HAVING A READ/WRITE ADDRESS BUS AND PROCESS FOR WRITING TO AND READING FROM THE SAME

This is a divisional of U.S. Ser. No. 09/238,954, filed Jan. 27, 1999, now issued as U.S. Pat. No. 6,262,937.

This application claims the benefit of U.S. Provisional Application No. 60/078,029, filed Mar. 13, 1998, and is hereby incorporated by reference in its entirety.

BACKGROUND OF THE INVENTION

This invention relates generally to the field of semiconductor and/or integrated circuit devices, and more particularly to a random access memory and process for writing to and reading from the same.

OBJECTS OF THE INVENTION

The primary object of the invention is to provide a random access memory that increases data throughput.

Another object of the invention is to provide such a random access memory that reduces the chip area dedicated to transmitting and/or storing address information.

Another object of the invention is to provide a random access memory and method of operating the same in which read and write operations may be executed in the same clock cycle.

Yet another object of the invention is to provide such a random access memory and method of operating the same in which fully random addresses may be employed.

Still yet another object of the invention is to provide such a random access memory and method of operating the same in which successive and/or asserted addresses may be completely unrelated.

Another object of the invention is to provide such a random access memory and method of operating the same in which no restrictions are placed on successive and/or asserted addresses.

Another object of the invention is to provide such a random access memory and method of operating the same in which the same address may be used to read from and write to the memory in the same clock cycle.

A further object of the invention is to provide such a random access memory and method of operating the same in which a periodic signal (e.g., a clock) is the only control-type signal essential to operability.

Other objects and advantages of the present invention will become apparent from the following description, taken in connection with the accompanying drawings, wherein, by way of illustration and example, embodiments of the present invention are disclosed.

SUMMARY OF THE INVENTION

The present invention concerns a random access memory comprising: a data input bus, a data output bus, a random access memory array configured to transfer data to random write addresses and from random read addresses in said random access memory array, an address bus providing said random read addresses and said random write addresses, and a periodic signal configured to control data transfer operations (i) to said random access memory array in response to a first transition or logic level of said periodic signal and (ii) from said random access memory array in response to a second transition or logic level of said periodic signal, wherein said second transition or logic level of said periodic signal is complementary to said first transition or logic level of said periodic signal.

In a further embodiment, the present invention concerns a process for reading data from and writing data to a random access memory array, comprising the steps of transferring a first plurality of data bits on a first unidirectional bus either to or from a first random address in said random access memory array in response to a first transition or logic level of a periodic signal, and transferring a second plurality of data bits on a second unidirectional bus either from or to a second, independent random address in said random access memory array in response to a second, complementary transition or logic level of said periodic signal (i.e., in the opposite manner from the first step).

BRIEF DESCRIPTION OF THE DRAWINGS

The drawings constitute a part of this specification and include exemplary embodiments to the invention, which may be embodied in various forms. The features and advantages of the present invention are illustrated by way of example in the drawings, in which.

Figure 1:
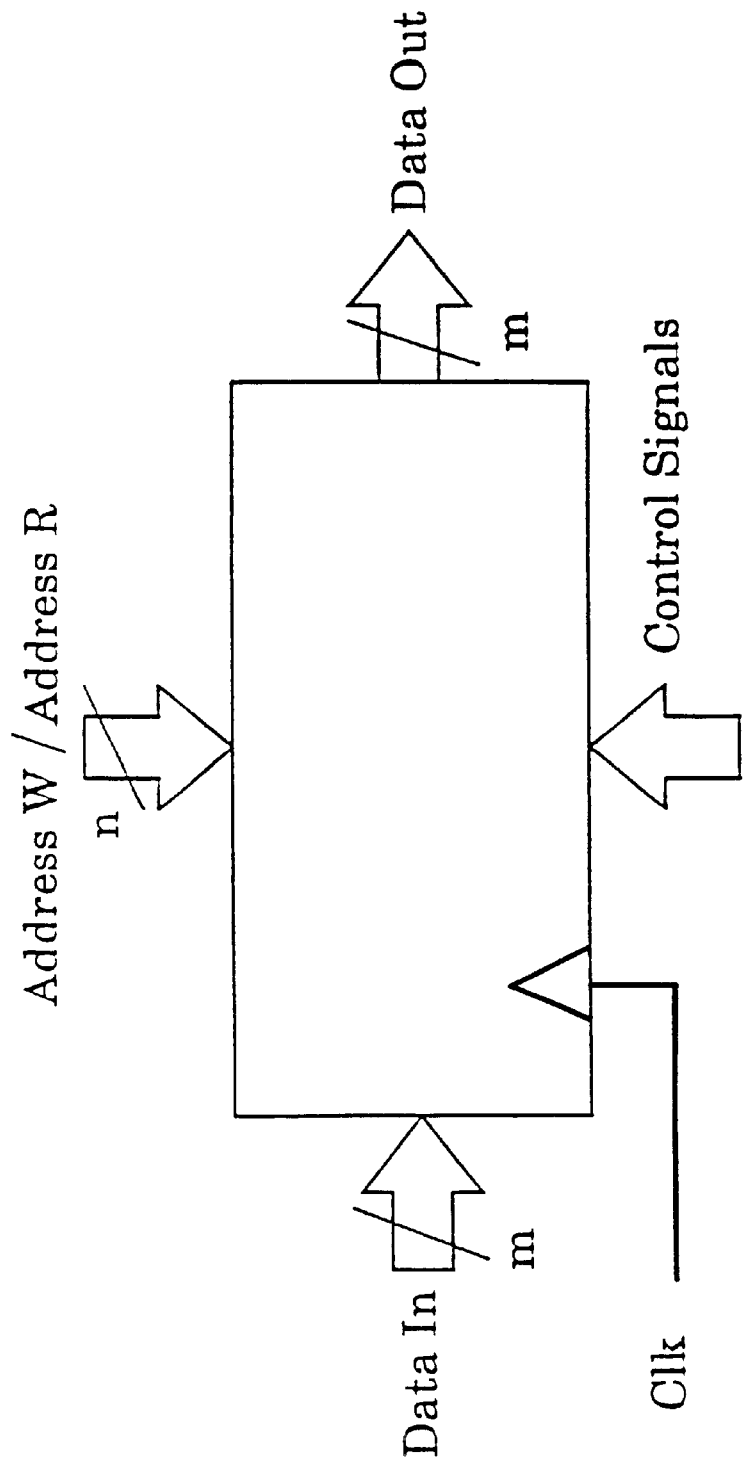
FIG. 1 shows an overview of the present random access memory (RAM) architecture.

It is to be understood that, in some instances, various aspects of the invention may be shown exaggerated or enlarged to facilitate an understanding of the invention, and in other instances, some aspects of the invention considered to be conventional may not be shown so as to avoid obfuscating more important aspects or features of the invention.

DETAILED DESCRIPTION OF THE PREFERRED EMBODIMENTS

Detailed descriptions of the preferred embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure or manner.

In the present random access memory, each of the data input bus, data output bus, and random access memory array may independently be m or n·m bits wide, where m is an integer $\geq 2$, preferably $\geq 4$, and more preferably $\geq 8$, and n is independently an integer $\geq 2$, preferably of 2–8, and more preferably of 24. In specific examples, m may be 8, 9, 16, 18, 32, 36, 64, 72, 128 or 144. The data input bus may receive data from an external source. In a preferred embodiment, each of the data input bus, data output bus, and address bus is unidirectional (i.e., data flows in one direction only).

In the present invention, a "periodic signal" refers to any signal that has an oscillating waveform, the frequency of which may be predicted and/or controlled in accordance with techniques known in the art, and that can be configured to control one or more circuit functions performed as part of a read operation or a write operation. The periodic signal may be configured to control one or more data transfer operations to or from the random access memory array in response to first and second transitions of the periodic signal, respectively, where the second transition is complementary to the first transition of the periodic signal. Therefore, the memory operates in a synchronous manner. For synchronous operations, the periodic signal may be an internal or external clock signal, or a periodic control signal such as output enable. There may be more than one independent periodic signal controlling read, write, register and/or data pass gate functions. Where appropriate and/or desirable, the periodic signals may comprise a first clock signal and its complement.

The present random access memory array may be configured to store and/or retrieve data at any random address therein. The address is defined by one or more signals on the address bus.

The present random access memory may further comprise circuitry operable to write data into the array at a first random address in response to at least one transition of the periodic signal. Similarly, the present random access memory may further comprise circuitry operable to read data from a random location in the array in response to at least one transition of the periodic signal. The periodic signal transitions to which the read circuitry and write circuitry respond are preferably complementary to each other.

As shown in FIG. 1, the present random access memory (RAM) architecture may comprise separate first and second ports (e.g., "Data In" and "Data Out") to access the memory array. The ports may be unidirectional, in which case each pair of ports (e.g., an input/output pair) may have a dedicated address bus comprising n address inputs (e.g., "Address W/Address R" in FIG. 1), where n is an integer of one or more, to maintain complete independence of the ports and their associated control logic. Separate data inputs and outputs eliminates the need to "turn around" the data bus as may be required with common I/O devices.

Accesses to the array through input and output ports may be somewhat independent of one another and are initiated synchronously with one or more periodic signals (e.g., an internal or external clock signal; a set of differential input clocks; etc.). In order to maximize data throughput, the input port transfers data on one of the rising or falling edges or during one of the sustained logic levels of the periodic signal cycle(s), and the output port transfers data on the other of the rising or falling edges or sustained logic levels of the periodic signal cycle(s) (see, e.g., input clock "Clk" in FIG. 1). As described herein, data transfer may also be logic level-triggered; i.e., it may occur in response to a particular or predetermined logic level of one or more periodic signal(s).

The depth of the memory array may be, in effect, expanded with two or more arrays and/or independent RAM devices (e.g., integrated circuit chips), and their associated select logic circuitry. The control signals carried by such logic circuitry (e.g., port select inputs) allow each port to operate as if it was an independent device, thereby further allowing depth expansion independently on each port.

All synchronous data inputs may be passed through one or more write registers (or input registers) controlled by the periodic signal(s). All data outputs may be passed through one or more read registers (and/or output registers), also controlled by the same or different periodic signal(s).

All writes may be conducted with on-chip synchronous self-timed write circuitry to simplify the interface logic.

EXAMPLE(S)

Figure 2:
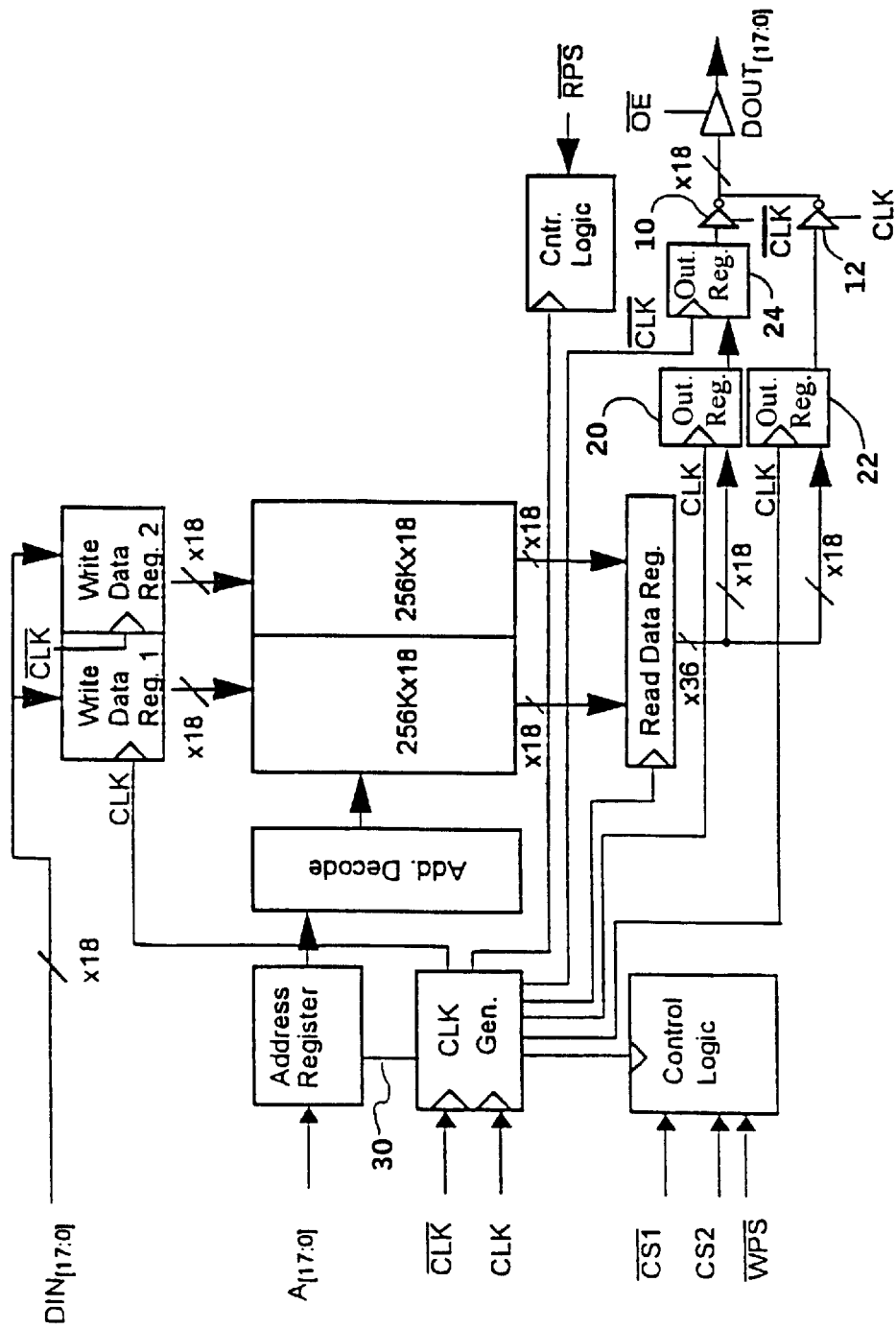
FIG. 2 shows a more detailed embodiment of the RAM architecture shown in FIG. 1.

As shown in FIG. 2, the present RAM architecture is, in a preferred embodiment, configured as a synchronous pipelined burst static RAM (SRAM). Data may flow unidirectionally into the SRAM through the Data In bus, and/or unidirectionally out through the Data Out bus. Each bus may have its own pads for receiving or transmitting external signals. The present RAM array receives address information on a single address bus (e.g., $A_{[17:0]}$) and may store or latch the address information in an address register. By separating the data input and data output ports, the present RAM avoids possible data contention and/or eliminates any need to "turn-around" the data bus.

Accesses for both data ports may be controlled by a single input clock or a pair of differential input clocks (CLK/CLK*, where a signal designated "X*" indicates the complement of the corresponding signal "X", similar to the signals in the Figures bearing an overstrike or "bar" designation). All synchronous timing may be referenced from the cross point of the differential input clock signals. Accesses can be initiated on any edge of any periodic signal (preferably on the rising edge of a clock signal, assuming any other control signals are asserted at their active logic levels), but for ease and simplicity of logic circuitry, accesses are initiated on the rising edge of the positive clock (CLK) only.

All data inputs (e.g., synchronous inputs DIN[17:0]) may pass through one or more m- or 2m-bit-wide input registers (e.g., m-bit-wide Write Data Reg. 1 and Write Data Reg. 2 as shown in FIG. 2), controlled by the rising or falling edge of the positive input clock (CLK). In such a case, the data input bus may have the same width as the input register(s).

The present random access memory may comprise one or more arrays (e.g., "256K×18") configured to store and/or retrieve data at a random read and/or write address therein. The arrays are generally oriented in rows and columns, where the number of rows may be from 1 to $2^x$+c, preferably from 4 to $2^x$+c, and more preferably from 16 to $2^x$+c, where x may be an integer of from 2 to 15, preferably from 3 to 14, and more preferably from 4 to 12, and c represents the number of redundant rows, which may be an integer of from 0 to 12, preferably from 0 to 8, and more preferably from 0 to ($2^x$/8), and the number of columns may independently be from 1 to $2^y$+d, preferably from 4 to $2^y$+d, and more preferably from 8 to $2^y$+d, where y may be an integer of from 0 to 10, preferably from 2 to 9, and more preferably from 3 to 8, and d represents the number of redundant columns, which may be an integer of from 0 to 8, preferably from 0 to 4, and more preferably from 0 to ($2^y$/8).

The address is defined by n signals on the address bus, where n is an integer of one or more, preferably 3 or more and more preferably of from 5 to $2^y$+d, where y and d are as defined above. Address information reaches the array from the address register through an address decoder, the signals from which identify the location(s) in the array where an operation is to be performed. The array, which may be m or n·m bits wide, preferably has the same width as the input register(s) and/or the data input bus.

The present random access memory may further comprise an output data register (e.g., Read Data Reg. in FIG. 2), which may also be m or n·m bits wide, and may have the same width as the input register(s), the array, and/or the data input bus. Preferably, the data output bus is also m or n·m bits wide, more preferably the same width as the data input bus, the input register(s), the array, and/or the output register (s). The output port may further comprise a plurality of pads (e.g., synchronous data outputs DOUT[17:0]) for providing the data externally.

When the random access memory comprises a plurality of arrays, the first random access memory array may receive data from a first data input bus and/or write data register, and the second random access memory array may receive data from a second data input bus and/or write data register. Similarly, a random access memory comprising a plurality of arrays may further comprise a plurality of data output busses and/or read data registers, the first and second read data registers respectively storing data transferred from the first and second random access memory arrays, and the first and second data output busses respectively transmitting data from the first and second random access memory arrays or read data registers. In this case, each random access memory array may further comprise (a) first circuitry operable to write data to the random access memory array(s) at a first random address and (b) second circuitry operable to read data from the random access memory array(s) at a second random address, each in response to successive transitions or logic levels of a periodic signal, the second random address being the same as or different from the first random address. Each array may also have a unique address bus for providing both read and write address information.

As shown in FIG. 2, the present random access memory may further comprise an m-bits-wide data output bus, first and second three-state output buffers (e.g., buffers 10 and 12), and first, second and third m-bits-wide output registers (e.g., Reg. 20, Reg. 22 and Reg. 24), wherein:

each of the first and second output registers store m bits of data from the output register in response to a first periodic signal transition or level, the third output register stores m bits of data from the first output register in response to a second, complementary periodic signal transition or level, the first three-state output buffer is enabled to provide data to the output data bus from the third output register by a third periodic signal transition or level (which may be [i] the same as or different from the second, complementary periodic signal transition or level, or [ii] a complement of the first periodic signal transition or level, and which preferably enables data output when in a particular or predetermined logic level or state), and the second three-state output buffer is enabled to provide data to the output data bus from the second output register in response to a fourth periodic signal transition or level (which may be [i] the same as or different from the first periodic signal transition or level or [ii] a complement of the second periodic signal transition or level, and which also preferably enables data output when in a particular or predetermined logic level or state).

Control inputs (e.g., one or more synchronous data input or write port select signals WPS or WPS*, one or more synchronous data output or read port select signals RPS or RPS*, etc;) may pass through control input registers controlled by an edge or logic level of a periodic signal (e.g., the rising edge of the positive clock input CLK). One may advantageously employ multiple port select signals (e.g., WPS1, WPS2, WPS1*, WPS2*, RPS1, RPS2, RPS1*, RPS2*, etc.) when one includes multiple random access memories in a given application (e.g., a data, voice and/or video communications device, such as a network switch or router). Preferably, each RAM in a given multiple-RAM application has at least one unique combination of read and at write port select signals that activate the particular port (e.g., WPS1* and WPS2, WPS1 and WPS2*, RPS1* and RPS2, RPS1 and RPS2*, etc.). Alternatively, the different input and/or output port select signals can select (enable or disable) one read or write register of a multiple-register configuration.

Transferring Data to and from the Array

In a further embodiment, the present invention relates to a process for reading data from and writing data to a random access memory array, comprising the steps of:

transferring a first plurality of data bits on a first unidirectional bus to a random write address in said random access memory array in response to a first transition or logic level of a write control signal, and transferring a second plurality of data bits on a second unidirectional bus from a random read address in said random access memory array in response to a second, complementary transition or logic level of said periodic signal.

Alternatively, the present process relates to the steps of:

transferring a first plurality of data bits on a first unidirectional bus from a random read address in said random access memory array in response to a first transition or logic level of a periodic signal, and transferring a second plurality of data bits on a second unidirectional bus to a random write address in said random access memory array in response to a second, complementary transition or logic level of said periodic signal.

In the present process, the second, complementary transition of the periodic signal is also the next transition following the first transition of the periodic signal. Similarly, the second, complementary logic level of the periodic signal is the logic level following the next transition of the periodic signal.

Reading

Figure 3:
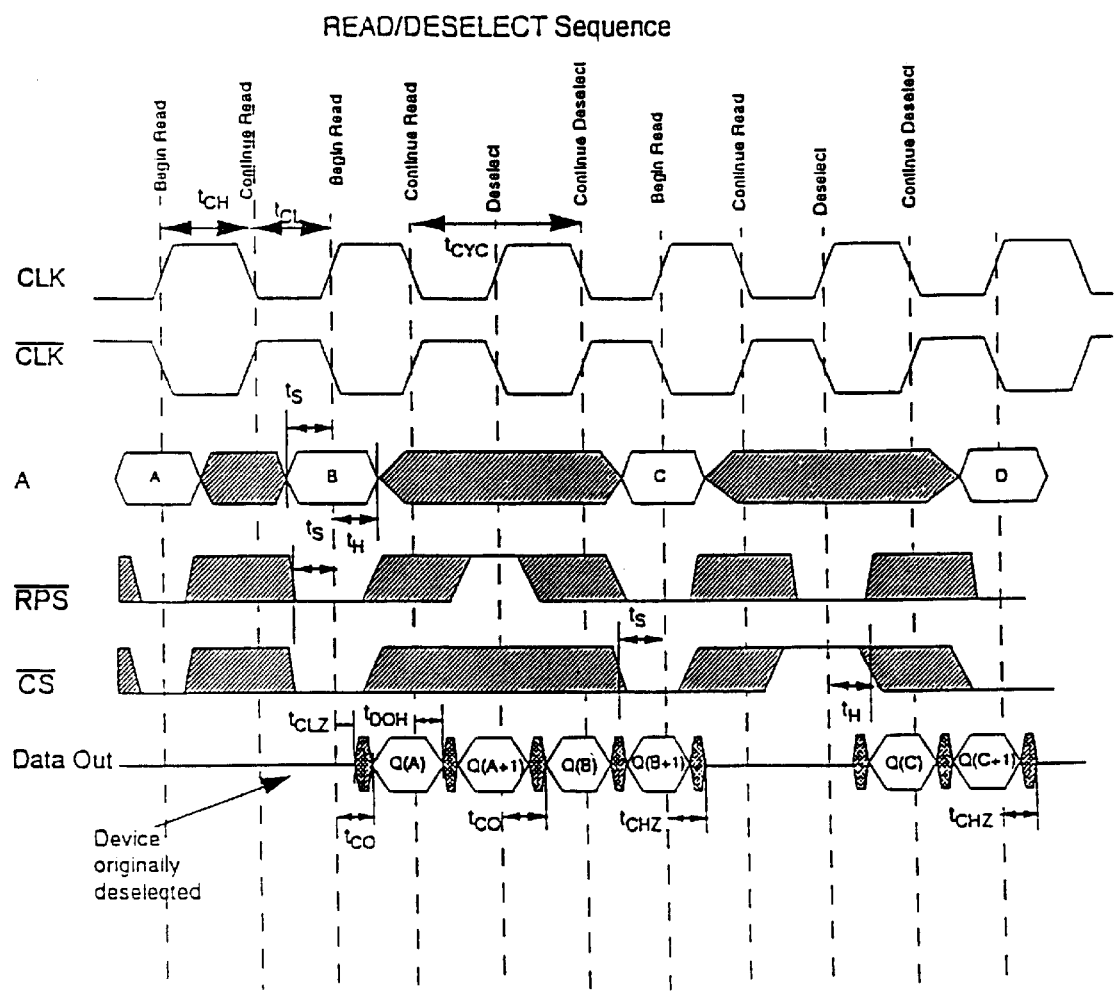
FIG. 3 shows various waveforms illustrating relative timing of various signals in conjunction with an exemplary read operation performed according to the invention.

As shown in FIG. 3, read operations may be initiated by asserting an output port select signal (e.g., RPS*) that is active at an appropriate periodic signal edge (e.g., positive clock rise [also see the CLK waveform]). The read address (es) on A[17:0] may be stored in the address register, preferably on (in response to) the same periodic signal edge as for reading from the array. The RAM may access from one to n m-bit-wide data words and store each in an output register (e.g., Reg. 20 and Reg. 22 in FIG. 2) on the same clock edge as that which latches the read address, but with one or more (preferably one) cycles of latency.

The RAM may access two data words with each read operation on the same clock edge as that which latches the read address. For example, referring to FIG. 2, the two data words (or one double-width data word) may be driven from the Read Data Reg. to output registers 20 and 22 on a single clock edge, then the first or lower word of data may be driven through output buffer 12 onto the output data bus DOUT on the clock logic level resulting from the single clock edge that latches the data in output register 22, provided any applied output control signal (e.g., an output enable signal OE) is asserted in an enabling state (e.g., LOW). On the subsequent clock transition, the second or higher order data word stored in output register 20 may be latched in output register 24, then driven through output buffer 10 onto the DOUT signals on the clock logic level resulting from the clock transition that latches the second data word in output register 24, provided any applied ouput control signal remains asserted in an enabling state. In this configuration, all data may be available, for example, as soon as 3.5 ns after clock rise (assuming a 125 MHz read/write control signal), providing a read operation with essentially no cycles of latency.

On the same transitions of the subsequent clock cycle, the next data word(s) stored in the array is/are latched in the output register(s), then driven through the three-state output buffer onto the DOUT bus/pads on the same clock logic levels as before.

Read accesses can be initiated, for example, on every rising edge of the positive clock. Doing so will "pipeline" the data flow such that data is transferred out of the device on every rising and falling edge of the clock.

When deselected, the present RAM may first complete the pending read transactions. Synchronous internal circuitry may automatically three-state the outputs following the next rising edge of the positive clock. This will allow for a seamless transition between a port in the present RAM and any external device (including without limitation a second RAM according to the invention) without the insertion of wait states.

Table 1 below shows a truth table for the read port in the exemplary read operation. The identity and description of signal names in Table 1 can be found in Table 3 below.

address(es) presented to A[17:0] may be stored in the address register on the same clock edge as that which initiates the write operation. However, the information presented to the data inputs (e.g., DIN[17:0]) may be stored in the first input register (e.g., Write Data Reg. 1 in FIG. 2) on the positive clock rise of CLK. On the falling edge of the positive clock, the information presented to DIN[17:0] is stored in the second input register (see Write Data Reg. 2 in FIG. 2). On this falling positive clock edge, the corresponding 2 m-bit-wide word of data is written into the array.

Write accesses can be initiated on every falling edge of the same clock that initiates read accesses (or on the rising edges of the complementary clock). Doing so will pipeline the data flow such that data is transferred into and out of the device on every cycle of the clock.

When deselected, the input port will ignore all inputs thereto.

Table 2 above shows a truth table for the write port in the exemplary write operation. The identity and description of signal names in Table 2 can be found in Table 3 below.

The input and output ports in the present RAM architecture may operate independently of one another. One can read or write to any location in the memory array, regardless of the transaction address on the other port. Should the input and output ports access the same location on the same cycle of the periodic signal, the information presented to the data inputs may be forwarded to the data outputs (by, e.g.,

TABLE 1

Read Port Cycle Description Truth Table[1,2]

| Operation | Address used | RPS2 | $\overline{\text{RPS1}}$ | CLK | Comments |
|---|---|---|---|---|---|
| Deselected | — | X | H | L-H | $\overline{\text{RPS1}}$ deselects Read port. Outputs three-state following next rising edge of positive clock (CLK) |
| Deselected | — | 0 | X | L-H | RPS2 deselects Read Port. Outputs three-state following next rising edge of positive clock (CLK) |
| Begin Read | -External | 1 | 0 | L-H | Read operation initiated on previous clock rise. Address are stored in the Read Address Register. Following the next clock rise the first (lower order) word will be driven out onto DOUT$_{[17:0]}$ provided $\overline{\text{OE}}$ is driven LOW. On the subsequent falling edge of the positive clock (CLK) the second (higher order) word is driven out onto DOUT$_{[17:0]}$ provided $\overline{\text{OE}}$ is driven LOW. If the asynchronous $\overline{\text{OE}}$ is HIGH, the output buffers will remain in a three-state condition |

Notes:
[1]X = Don't Care, 1 = Logic HIGH, 0 = Logic LOW.
[2]Device will power-up deselected and the outputs in a three-state condition, regardless of $\overline{\text{OE}}$.

Writing

Figure 4:
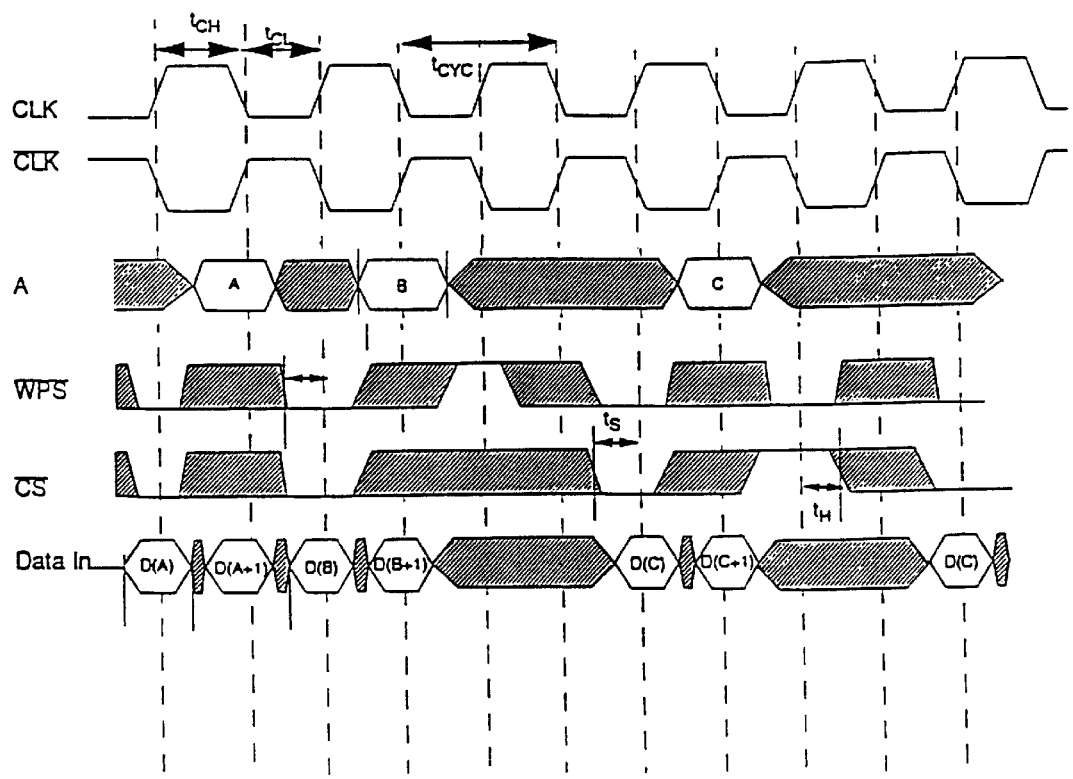
FIG. 4 shows various waveforms illustrating relative timing of various signals in conjunction with an exemplary write operation performed according to the invention.

As shown in FIG. 4, write operations may be initiated by asserting an input port select signal (e.g., WPS*) that is active at an appropriate periodic signal edge (e.g., positive clock rise of CLK* or a falling edge of CLK). The write conventional bypass logic circuitry responsive to a control signal generated in response to an AND- or NAND-type logic comparison of the read and write addresses), or alternatively, the data stored in the output register may first be output on the data output bus, then the same location written with the new data.

TABLE 2

Write Port Cycle Description Truth Table

| Operation | Address used | WPS2 | $\overline{\text{WPS}}$ | CLK | Comments |
|---|---|---|---|---|---|
| Deselected | — | X | H | L-H | $\overline{\text{WPS1}}$ deselects Write Port. All Write Port inputs are ignored. |

TABLE 2-continued

Write Port Cycle Description Truth Table

| Operation | Address used | WPS2 | $\overline{\text{WPS}}$ | CLK | Comments |
|---|---|---|---|---|---|
| Deselected | — | 0 | X | L-H | WPS2 deselects Write Port. All Write Port inputs are ignored. |
| Begin Read | -External | 1 | 0 | L-H | Read operation initiated. Address are stored in the Read Address Register. Following the next clock rise the first (lower order) word will be driven out onto $DOUT_{[17:0]}$ provided $\overline{\text{OE}}$ is driven LOW. On the subsequent falling edge of the positive clock (CLK) the second (higher order) word is driven out onto $DOUT_{[17:0]}$ provided $\overline{\text{OE}}$ is driven LOW. If the asynchronous $\overline{\text{OE}}$ is HIGH, the output buffers will remain in a three-state condition |

The present RAM architecture may have one or more Port Select inputs for each port, allowing for easy depth expansion. Port Selects may be sampled on a particular edge or logic level of any periodic signal, but the input port select is preferably sampled on the rising edge of the positive clock input (CLK), and the output port select is preferably sampled on the falling edge of the positive clock input (CLK). Either port select input can deselect the specified port (e.g., an active output port select deselects the output port). Deselecting a port will not affect the other ports. All pending transactions (Read and/or Write) are preferably completed prior to the port being deselected.

The identity and description of signal names in FIG. 3 can be found in Table 3 below.

Reading and Writing

Figure 5:
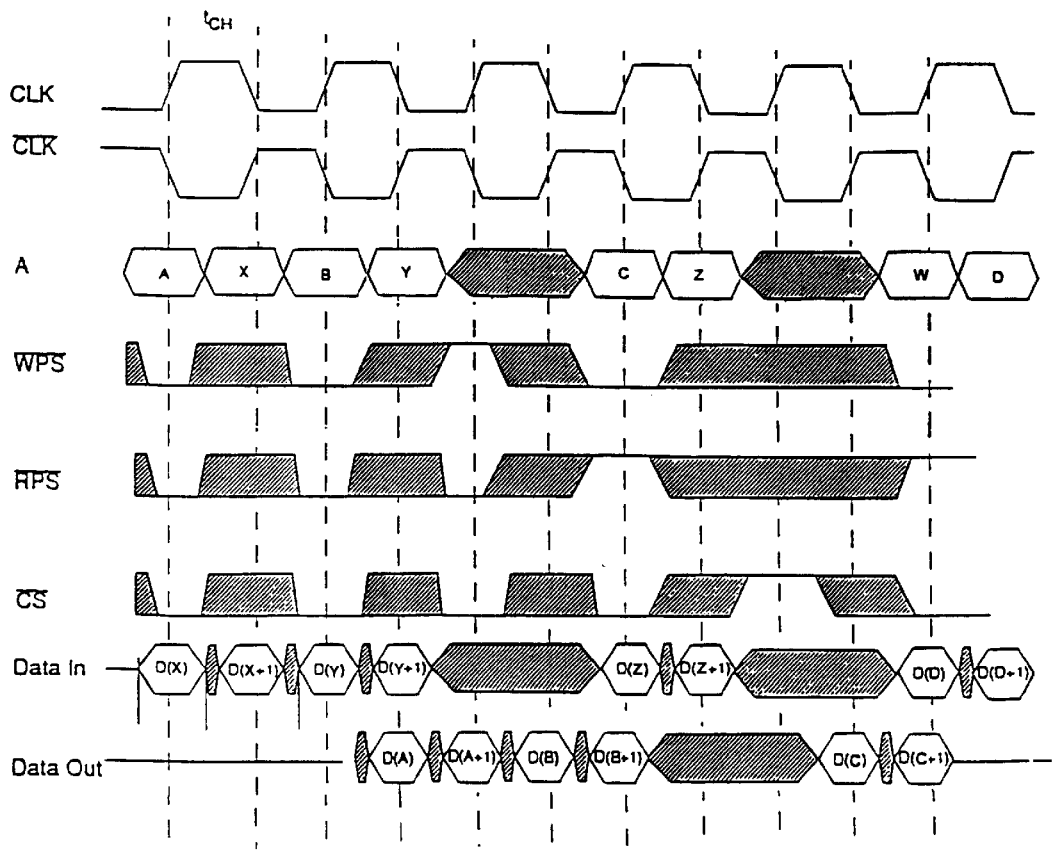
FIG. 5 shows various waveforms illustrating relative timing of various signals in conjunction with an exemplary read/write operation performed according to the invention.

FIG. 5 shows the sequence of data transfer events occurring during read and write operations. Table 3 below shows the identity and description of the exemplary input signals shown and/or described in FIGS. 1–5. The letters "A", "B", "C", etc., refer to addresses (e.g., word addresses for either two m-bit-wide words or one 2 m-bit-wide word) in the RAM array. The terms "D(A)", "D(B)", etc., and "D(A+1)", "D(B+1)", etc., respectively refer to a first or lower order data word and a second or higher order data word written to or read from the corresponding address "A", "B", "C", etc., when writing, e.g., m-bit-wide words and/or latching data into m-bit-wide input registers. Thus, for 2 m-bit-wide circuitry, "D(A)" and "D(A+1)", "D(B)" and "D(B+1)", etc., refer to a single 2 m-bit-wide data word. In this example, the signal "CS*" represents a logical combination of two external chip select signals (see CS1 and CS2 in Table 3 below).

As shown in FIG. 5, address A is latched or written into the address register from the address bus during the positive clock CLK transition from LOW to HIGH. Address A is present on the address bus at a time about $t_S$ ns before the crossover of CLK and CLK* (the "setup time"; see waveform A in FIG. 3). The address is maintained on the address bus for a period of time of about $(t_S+t_H)$ ns (the "setup and hold time"; see, e.g., waveform A in FIG. 3). The read port select signal is asserted briefly (and preferably while the periodic signal(s) CLK and/or CLK* is/are transitioning), and the next rising transition of the periodic signal CLK latches the data words D(A) and D(A+1) from address A in the array(s) through the read data register into first and second output registers 20 and 22. The HIGH logic level of CLK resulting from this transition enables output buffer 12 and outputs D(A) to the data output bus. For m-bit-wide circuitry, a complementary transition of the periodic signal may then latch data word D(A+1) from output register 20 and into a shadow register (e.g., register 24 in FIG. 2). The LOW logic level of CLK resulting from this complementary CLK transition enables output buffer 10 and outputs D(A+1) onto the data output bus and the data output pads.

The first transition of the periodic signal CLK also latches the data word D(X) on the Data In bus into the first write register. Similar but complementary to the read operation described immediately above, address X is latched or written into the address register from the address bus during the second, falling CLK transition from HIGH to LOW. The new address signal, or address transition from A to X, occurs at least about $t_S$ ns before the crossover of CLK and CLK*. The falling transition of the CLK pulse, sent on the clock generator-to-address register bus (see bus 30 in FIG. 2), enables the address register to store the X address that is on the address bus at the time of the transition. Address X is also maintained for a period of time of about $(t_S+t_H)$ ns.

Address X is latched into the address register from address bus A while the write port select signal is asserted (and while the periodic signal is transitioning). The second, complementary CLK transition (i.e., relative to the CLK transition that latches data word D(X) into the first write register) also latches data word D(X+1) on the Data In bus into the second write register, and writes the data words D(X) and D(X+1) at address X in the first and second arrays, respectively, as shown for example in FIG. 2. Alternatively, for 2 m-bit-wide circuitry, the rising transition of the positive periodic signal CLK latches a single 2 m-bit-wide data word in a single write data register.

While the invention has been described in connection with certain preferred embodiments, it is not intended to limit the scope of the invention to the particular form set forth, but on the contrary, it is intended to cover such alternatives, modifications, and equivalents as may be included within the spirit and scope of the invention as defined by the appended claims.

TABLE 3

| Pin Number | Name | I/O | Description |
|---|---|---|---|
| | $DIN_{[17:0]}$ | Input-Synchronous | Data input signals, sampled on the rising and subsequent falling edge of CLK during the data portion of the write operations. The Data presented to $DIN_{[17:0]}$ can be read from the device on $DOUT_{[17:0]}$. |
| | $\overline{WPS1}$ WPS2 | Input-Synchronous | Write Port Selects, active LOW and HIGH, respectively. Sampled on the rising edge of CLK. When active, a write operation is intiated. $\overline{WPS1}$ and WPS2 are qualified with chip selects ($\overline{CS1}$ and CS2) |
| | $WA_{[17:0]}$ | Input-Synchronous | Write Address inputs. Sampled on the rising edge of the CLK during a write operation. These inputs are ignored during the falling edge of the positive clock (CLK). These inputs are qualified with $\overline{WPS}$, $\overline{CS1}$ and CS2. |
| | $DOUT_{[17:0]}$ | Outputs- | Data Outputs signals. These pins drive out the requested data during a Read operation. The data driven out on $DOUT_{[17:0]}$ is the same data written in on $DIN_{[17:0]}$. |
| | $\overline{RPS1}$ RPS2 | Input-Synchronous | Read Port Selects, active LOW and HIGH, respectively. Sampled on the rising edge of CLK. When active, a read operation is intiated. $\overline{RPS1}$ and RPS2 are qualified with chip selects ($\overline{CS1}$ and CS2) |
| | $RA_{[17:0]}$ | Input-Synchronous | Read Address inputs. Sampled on the rising edge of the CLK during a read operation. These inputs are ignored during the falling edge of the positive clock (CLK). These inputs are qualified with $\overline{RPS}$, $\overline{CS1}$ and CS2. |
| | $\overline{OE}$ | Input-Asynchronous | Output Enable, active LOW. This is an asynchronous input that controls the output drivers of the device. When deselected using $\overline{RPS}$, the output drivers are automatically three-stated, regardless of the state of $\overline{OE}$. |
| | $\overline{CS1}$ | Input-Synchronous | Chip Selects 1, active LOW. Sampled on the rising edge of the positive clock (CLK). This signal is used in conjunction with CS2 to select or deselect the device. |
| | CS2 | Input-Synchronous | Chip Selects 2, active HIGH. Sampled on the rising edge of the positive clock (CLK). This signal is used in conjunction with $\overline{CS1}$ to select or deselect the device. |
| | CLK | Input-Clock | Positive Clock input. Used to capture all synchronous inputs to the device. All accesses are initiated on the rising edge of CLK. The crosspoint of CLK and $\overline{CLK}$ are used to capture all synchronous inputs to the device. |
| | $\overline{CLK}$ | Input-Clock | Negative Clock input. Complimentary to CLK. The crosspoint of CLK and $\overline{CLK}$ are used to capture all synchronous inputs to the device. CLK is used to capture DIN and drive DOUT. |
| | $V_{DD}$ | Power Supply | Power supply inputs to the core of the device. Should be connected to 2.5 V power supply. |
| | $V_{SS}$ | Ground | Ground for the core of the device. Should be connected to ground of the system. |
| | $V_{DDQ}$ | Power Supply | Power supply inputs for the outputs of the device. Should be connected to 2.5 V power supply. |
| | $V_{SSQ}$ | Ground | Ground for the outputs of the device. Should be connected to ground of the system. |

What is claimed is:

1. A process for reading data from and writing data to a random access memory array, comprising the steps of:

transferring a first plurality of data bits on a first unidirectional bus to a random write address in said random access memory array in response to a first transition of a periodic signal, and transferring a second plurality of data bits on a second unidirectional bus from a random read address in said random access memory array in response to a second, complementary transition of said periodic signal.

2. The process of claim 1, wherein said second, complementary transition of said periodic signal is also the next transition following said first transition of said periodic signal.

3. A process for reading data from and writing data to a random access memory array, comprising the steps of:

transferring a first plurality of data bits on a first unidirectional bus from a random read address in said random access memory array in response to a first transition of a periodic signal, and transferring a second plurality of data bits on a second unidirectional bus to a random write address in said random access memory array in response to a second, complementary transition of said periodic signal.

4. The process of claim 3, wherein said second, complementary transition of said periodic signal is also the next transition following said first transition of said periodic signal.

5. The process according to claim 1, wherein said periodic signal comprises a differential input clock pair having a first clock signal configured to generate said first transition and a second clock signal configured to generate said second transition.

6. The process according to claim 3, wherein said periodic signal comprises a differential input clock pairs having a first clock signal configured to generate said first transition and a second clock signal configured to generate said second transition.

* * * * *